(12) United States Patent
Ohnishi et al.

(10) Patent No.: US 6,943,624 B2
(45) Date of Patent: Sep. 13, 2005

(54) RADIO FREQUENCY POWER AMPLIFIER

(75) Inventors: Masami Ohnishi, Hachioji (JP);
Hidetoshi Matsumoto, Kokubunji (JP);
Tomonori Tanoue, Machida (JP);
Osamu Kagaya, Tokyo (JP); Kenji Sekine, Hinode (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/161,737

(22) Filed: Jun. 5, 2002

(65) Prior Publication Data

US 2003/0025555 A1 Feb. 6, 2003

(30) Foreign Application Priority Data

Jul. 31, 2001 (JP) .................................... 2001-230958

(51) Int. Cl.$^7$ ............................ H03F 3/68; H03F 1/14; H03F 3/04
(52) U.S. Cl. ................ 330/124 R; 330/51; 330/124 D; 330/302
(58) Field of Search .............................. 330/124 R, 51, 330/124 D, 302

(56) References Cited

U.S. PATENT DOCUMENTS

| | | | |
|---|---|---|---|
| 5,256,987 A | * 10/1993 | Kibayashi et al. | .......... 330/295 |
| 5,973,557 A | 10/1999 | Miyaji et al. | |
| 6,252,461 B1 | * 6/2001 | Raab | .......................... 330/302 |
| 6,252,463 B1 | * 6/2001 | Kobayashi | .................. 330/311 |
| 6,472,934 B1 | * 10/2002 | Pehlke | .................... 330/124 R |

FOREIGN PATENT DOCUMENTS

| | | |
|---|---|---|
| CN | 1183673 A | 10/1997 |
| JP | 7-336168 | 6/1994 |

OTHER PUBLICATIONS

Hiroshi Okazaki et al., "Intermoduration in Switchless Amplifier Switching Configuration", Proceedings of the 2001 IEICE General Conference of Japan, English translation, 4 pages (filed previously in Japanese).

Hiroshi Okazaki et al., "Intermoduration in Switchless Amplifier Switching Configuration", Proceedings of the 2001 IEICE General Conference of Japan, p. 81.

Hiroshi Okazaki et al., "Efficient Transmission–Power–Control Scheme for Ku–Band High Power Amplifiers in Portable User Earth Terminals", IEEE Transactions on Microwave Theory and Techniques, vol. 49, No. 6, Jun. 2001, pp. 1167–1173.

* cited by examiner

*Primary Examiner*—Patricia Nguyen
(74) *Attorney, Agent, or Firm*—Reed Smith LLP; Stanley P. Fisher, Esq.; Juan Carlos A. Marquez, Esq.

(57) ABSTRACT

The present invention provides a radio frequency power amplifier which may not introduce radio frequency loss during switching power amplifier units between high and low output power levels. By connecting a first-stage matching network M12 and first-stage matching network M13 to respective output nodes of a power amplifier unit A11 and power amplifier unit A12 that either one operate by switching, connecting the output nodes of the first-stage matching network M12 and M13 in parallel, connecting a last-stage matching network M11 between the junction of M12 and M13 and the output terminal OUT, the first-stage matching networks M12, M13, and last-stage matching network M11 are formed, for both power amplifier units A11 and A12, so that impedance matching is established between the output terminal OUT and the power amplifier unit in operation when one unit is in operation the other is in stop of operation. The present invention allows switching from one power amplifier unit to the other without the need of a radio frequency switch.

7 Claims, 8 Drawing Sheets

——— : INPUT POWER v.s. OUTPUT POWER CHARACTERISTIC OF HIGH OUTPUT POWER AMPLIFIER

– – – – : EFFICIENCY CHARACTERISTIC OF HIGH OUTPUT POWER AMPLIFIER

——— : INPUT POWER v.s. OUTPUT POWER CHARACTERISTIC OF LOW OUTPUT POWER AMPLIFIER

- - - - - : EFFICIENCY CHARACTERISTIC OF LOW OUTPUT POWER AMPLIFIER

RADIO FREQUENCY POWER AMPLIFIER

BACKGROUND OF THE INVENTION

The present invention relates to an improved efficiency of radio frequency power amplifiers for use in portable cellular phone terminals and base stations incorporated in a mobile communication system.

Recently, in the field of the mobile communication, scaling down in the size and weight is requested not only for the portable cellular terminals but also for the base stations. Along with this trend is further requested the improvement of the efficiency of the power amplifiers, which affects mostly the electric consumption of the whole system. The portable cellular phone terminal, which usually use a battery for their main power source, may have a major problem that requires to improve the efficiency of the phone terminal, by saving the power consumption in the power amplifier unit which drains the most power in the circuitry, in order for the terminal to sustain its operating time. In addition, since the radio frequency power amplifier are installed near their antenna for the objective of decreasing some transmission line loss in the cable and the like, shrinking the size and improving the efficiency of radio frequency power amplifier is highly required.

In general, the efficiency of an radio frequency power amplifier using semiconductor elements will be increasingly higher if the output power is higher, and will be highest at the yieldable maximum output, i.e., in vicinity of the saturated output power level. Also, the saturated output power level may be dependent on the size of semiconductor elements used.

When making a power amplifier of low saturated output power level by using smaller semiconductor elements in order to improve the efficiency at lower output power, output power required may not be sufficient at higher output power state. On contrary, when making a power amplifier of higher efficiency at some high saturated output power level using larger semiconductor elements, the efficiency will be decreased at lower output level.

It can be seen from the foregoing by those skilled in the art that it is quite difficult to operate one single power amplifier at high efficiency in both lower and higher output power mode. As a solution it has been proposed, as disclosed for example as a circuit embodiment in Japanese Patent Laid-open (Kokai) No. Hei 7-336168, a circuit arrangement which may be able to yield an improved efficiency at both higher and lower output power modes, by providing a plurality of output stage power amplifiers each having a different saturation output power level and by switching to one most convenable output stage power amplifier in accordance with the output power, by means of a switch.

A typical example of conventional power amplifier capable of switching output power stage in accordance with the desired output level is shown in FIG. 16. In the figure, an incoming radio frequency signal that have been received by input terminal IN1 will be amplified in high output power amplifier component A161 designed to be used for high output power level. An amplified signal then will be passed through a matching network M161 to a radio frequency switch SW1 used for switching the signal path. Meanwhile a radio frequency signal incoming via input terminal IN2 will be amplified by low output power amplifier component A162 designed to be used for low output power level, and will be passed through another matching network M162 to the radio frequency switch SW1. The radio frequency switch SW1 will be turned to the high output power amplifier component A161 for high output power mode (in which case the low output power amplifier component A162 will be put into stop of operation state), or will be turned to the low output power amplifier component A162 if lower output power is required (in which case the high output power amplifier component A161 will be put into stop of operation state). Thus through output terminal OUT will be delivered output a signal amplified either one of output power amplifier elements.

SUMMARY OF THE INVENTION

In the Prior Art, as have been described in the foregoing description, improvement of the efficiency has been achieved in both high and low output power modes by switching by the radio frequency switch SW1 the output signal from either the high output power amplifier component A161 for use in the high output power mode or from the low output power amplifier component A162 for use in the low output power mode. In this circuit design, the radio frequency switch SW1 is placed after the high and low output power amplifier components A161 and A162, so that inevitably the effective improvement of efficiency may not be sufficient because of decreased efficiency due to the loss at this section. In addition, some electric power will be needed in order to operate the radio frequency switch SW1, power consumption of the switch may also introduce inevitable loss of efficiency.

Moreover, to supply a signal to the input terminal IN1 and input terminal IN2, a radio frequency switch (not shown) is used. The insertion loss of the radio frequency switch may also cause some decrease of efficiency, as similar to the output side.

Accordingly, an object of the present invention is to provide a radio frequency power amplifier which may not introduce radio frequency loss when switching power amplifiers (amplifying elements) for high output power and low output power.

The object of the present invention may be efficiently achievable by connecting each of first-stage matching networks to the output node of respective one of at least two power amplifier units having a different saturated output power level from each other and being used in operation by switching, connecting the output nodes of the first-stage matching networks together in parallel to make a junction, connecting a last-stage matching network between the junction and an output terminal, and forming the first-stage matching networks and the last-stage matching network so that impedance matching is established between the output impedance of the power amplifier unit in operation and the output characteristic impedance at the output terminal, for each of the at least two power amplifier units, when any one of the at least two power amplifier units is in operation and the other in stop of operation. By adopting such a means, the power amplifier units may satisfy the condition of impedance matching while supplying an output signal to the output terminal, without the need of inserting a radio frequency switch.

In addition, the object of the present invention may also be achieved by connecting each of other last-stage matching networks to an input node of respective one of at least two power amplifier units having a different saturated output power level from each other and being used in operation by switching, in addition to the connection to the above described output side thereof, connecting the input nodes of the last-stage matching networks together in parallel to make another junction, connecting another first-stage matching network between the another junction and an input terminal, and forming the other last-stage matching networks and the another first-stage matching network so that impedance matching is established between the input impedance of the power amplifier unit in operation and the input characteristic impedance at the input terminal, for each of the at least two power amplifier units, when any one of the at least two power amplifier units is in operation and the other in stop of operation. By adopting such a means, the power amplifier units may satisfy the condition of impedance matching while supplying an output signal to the output terminal, as well as may satisfy the condition of impedance matching while accepting an input signal from the input terminal.

These and other objects and many of the attendant advantages of the invention will be readily appreciated as the same becomes better understood by reference to the following detailed description when considered in connection with the accompanying drawings.

DETAILED DESCRIPTION OF THE PREFERRED EMBODIMENTS

A detailed description of some preferred embodiments shown in the accompanying drawings embodying the radio frequency power amplifier of the present invention will now be given, in greater details, by referring to the accompanying drawings.

<First Embodiment>

Figure 1:
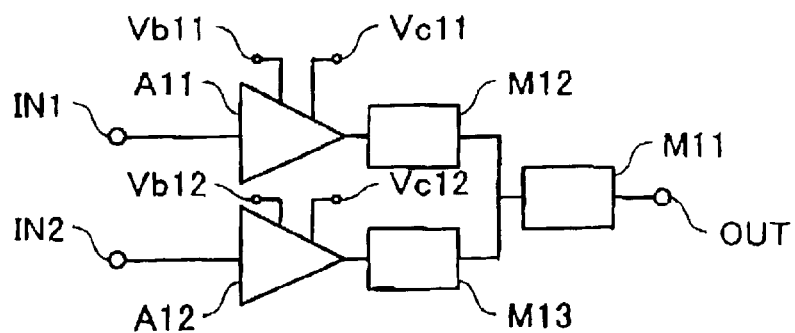
FIG. 1 is a schematic block diagram illustrating a first preferred embodiment of the radio frequency power amplifier in accordance with the present invention.

Now referring to FIG. 1, reference numeral A11 is designated to a high output power amplifier unit, A12 is to a small output power amplifier unit, M12 and M13 are first-stage matching networks connected to the output nodes of power amplifier unit A11 and power amplifier unit A12, respectively, M11 is to a last-stage matching network connected between the junction node of the output nodes of matching networks M12 and M13 and the output terminal OUT. The power amplifier unit A11 and power amplifier unit A12 are both formed of one single amplifier chip. An input signal will be fed to the power amplifier unit A11 via input terminal IN1, and to the power amplifier unit A12 via input terminal IN2. The power amplifier unit A11 incorporates base voltage terminal Vb11 and collector voltage terminal Vc11 and similarly the power amplifier unit A12 incorporates base voltage terminal Vb12 and collector voltage terminal Vc12.

In operation at high output power mode, a radio frequency signal supplied from the input terminal IN1 will be fed to the power amplifier unit A11 with a larger saturated output power to be amplified therein and then will be passed through the matching network M12 and matching network M11 to output to the output terminal OUT. In this condition the power amplifier unit A12 will be put into stop of operation mode by lowering the base potential to the base voltage terminal Vb12 or the collector potential to the collector voltage terminal Vc12. Both of the base potential and collector potential to the base voltage terminal Vb12 and collector voltage terminal Vc12, respectively, may be pulled down at the same time, instead of either one.

In operation at low output power mode, a radio frequency signal fed from the input terminal IN2 will be supplied to the power amplifier unit A12 with a smaller saturated output power to be amplified therein and then will be passed through the matching network M13 and matching network M11 to output to the output terminal OUT. In this mode the power amplifier unit A11 will be put into stop of operation mode by decreasing the base potential to the base voltage terminal Vb11 or the collector potential to the collector voltage terminal Vc11. Both of the base potential and collector potential to the base voltage terminal Vb11 and collector voltage terminal Vc11, respectively, may be pulled down at the same time.

Figure 2:
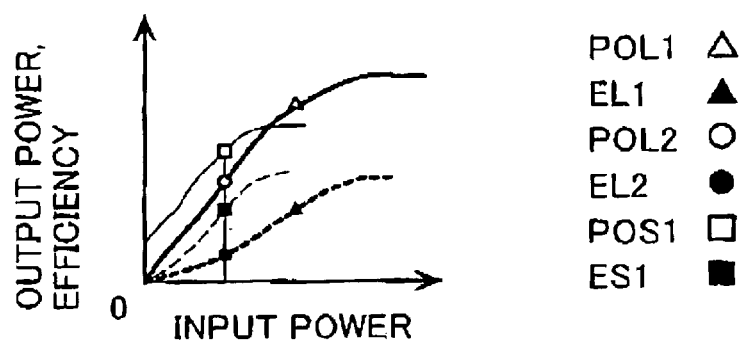
FIG. 2 is a schematic graph illustrating the relationship between the input power and output power of and between input power and efficiency of the small output power amplifier unit and the high output power amplifier unit shown in FIG. 1.

The power amplifier unit A11 and power amplifier unit A12 may have characteristics as shown in FIG. 2. The output from the power amplifier unit A11 is indicated as high output power point of high output power amplifier unit POL1, and the efficiency at that point is indicated as high output power efficiency of high output power amplifier unit EL1.

Similarly, the output from the power amplifier unit A12 is indicated as small output power point of low output power amplifier unit POS1, and the efficiency at that point is indicated as small output power efficiency of small output power amplifier unit ES1. A large output power efficiency EL1 and small output power efficiency ES1 may be achieved at an approximately same high level by switching the operational unit between the power amplifier unit A11 and power amplifier unit A12 for large or small output power level.

In an assumption that lower output power is supplied from the power amplifier unit A11 by decreasing the input power level thereto, the output power level and efficiency of the power amplifier unit A11 will be as indicated by respectively the low output power point of the high output power amplifier unit POL2 and low output power efficiency of the high output power amplifier unit EL2, resulting in that significant decrease of efficiency.

It is to be noted here that although the power amplifier unit A11 and power amplifier unit A12 in this preferred embodiment are both made as one single chip of amplifier element, as have been described above, these units may equivalently be arranged from a plurality of power amplifier elements.

Figure 3:
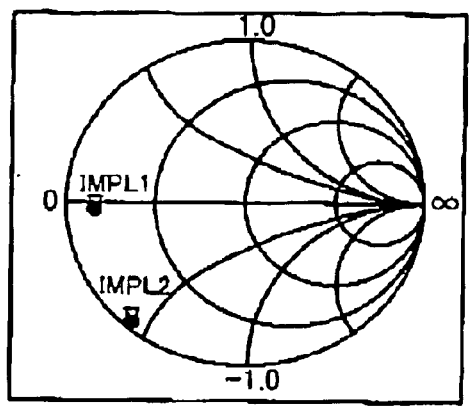
FIG. 3 is a chart depicting the output impedance in operation and in stop of operation of the high output power amplifier unit shown in FIG. 1.
Figure 4:
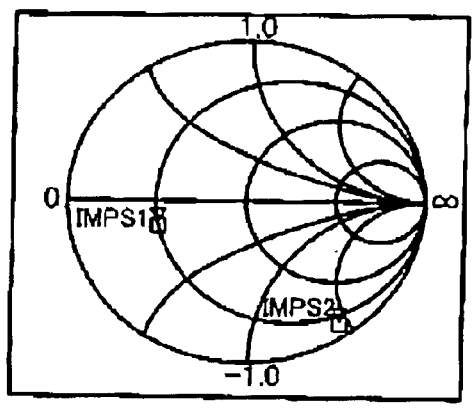
FIG. 4 is a chart depicting the output impedance in operation and in stop of operation of the low output power amplifier unit shown in FIG. 1.

The impedance matching in order to achieve the switching operation in accordance with the present invention will be now described in greater details. Referring to FIG. 3, there is shown a Smith chart with output power impedance IMPL1 at the time when the high output power amplifier unit is in operation and output power impedance IMPL2 at the time when the high output power amplifier unit is in stop of operation. In a similar manner there is shown another Smith chart in FIG. 4 with output power impedance IMPS1 at the time when the low output power amplifier unit is in operation and output power impedance IMPS2 at the time when the low output power amplifier unit is in stop of operation.

In accordance with the configuration using the first-stage matching network M12, first-stage matching network M13, and last-stage matching network M11, impedance will be matched to satisfy matching conditions of both power amplifier unit A11 and power amplifier unit A12, namely, when the power amplifier unit A11 is in operation while the power amplifier unit A12 is in stop of operation, impedance matching will be performed so as to satisfy such a matching condition that the output power impedance IMPL1 with the high output power amplifier unit in operation may become the characteristic impedance at the output terminal OUT; when the power amplifier unit A11 is in stop of operation while the power amplifier unit A12 is in operation; when the high output power amplifier unit is in stop of operation and the power amplifier unit A12 is in operation then impedance matching will be performed so as to satisfy such a matching that the output power impedance IMPS1 with low output power amplifier unit in operation may become the characteristic impedance at the output terminal OUT.

Figure 5:
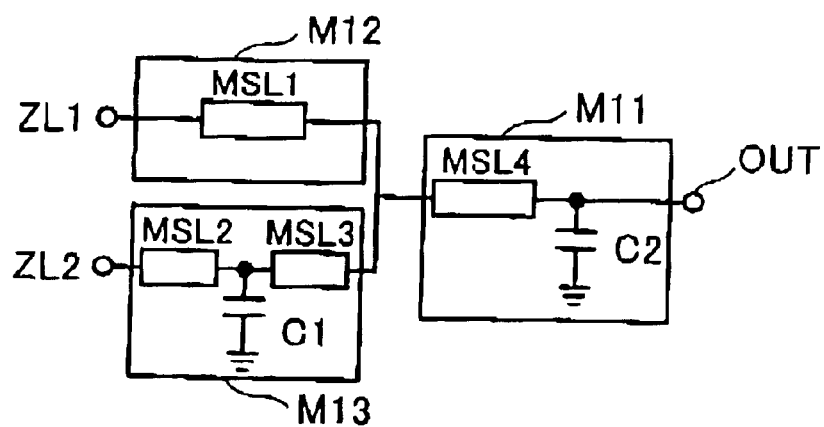
FIG. 5 is a schematic circuit diagram illustrating a typical example of matching network shown in FIG. 1.

The circuit configuration of matching networks M12, M13, M11 in accordance with the preferred embodiment is schematically shown in FIG. 5. The first-stage matching network M12 may be formed of a microstrip line MSL1. The first-stage matching network M13 may be formed of a microstrip line MSL2 and another microstrip line MSL3 in series thereto and a capacitance C1 connected to the junction of two microstrip lines. The matching network M11 may be formed of a microstrip line MSL4 and a capacitor C2 connected to the output terminal OUT thereof.

Figure 6:
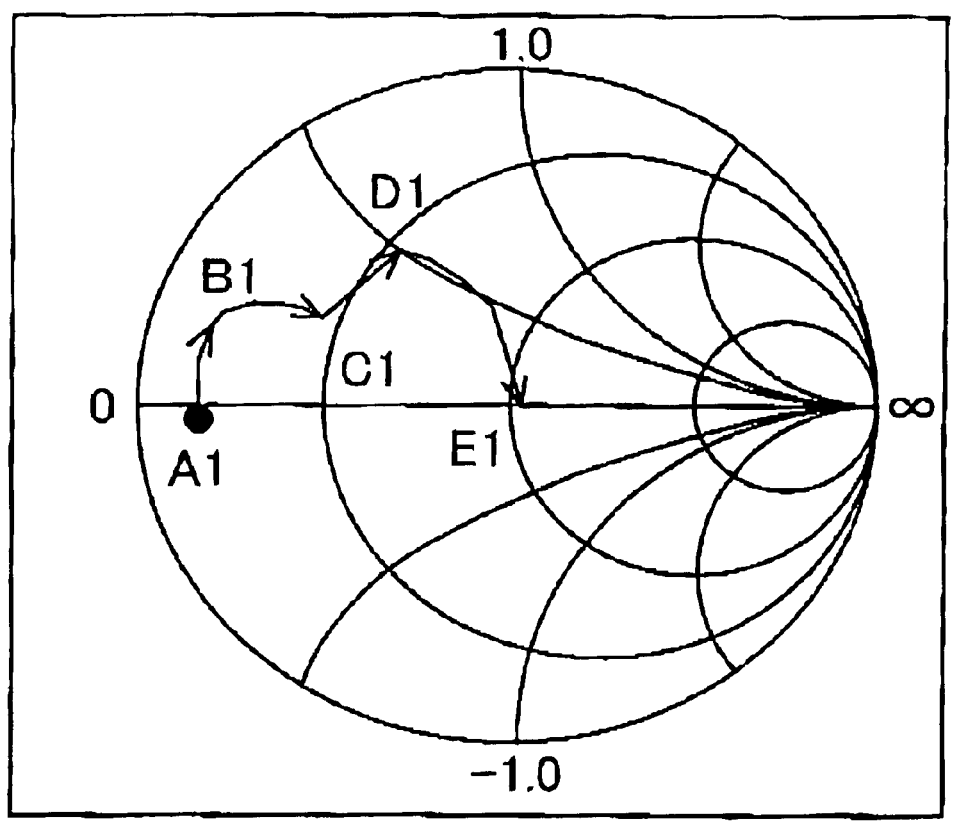
FIG. 6 is a chart describing the matching condition of the impedance matching network when the high output power amplifier unit is in operation and the low output power amplifier unit is in stop of operation.

When the output impedance of the high output power amplifier unit referred to as ZL1 is designated to the output power impedance IMPL1 of the high output power amplifier unit in operation mode and that the output impedance of the low output power amplifier unit referred to as ZL2 is designated to the output power impedance IMPL2 of the low output power amplifier unit in stop of operation mode, as shown in FIG. 6, point A1 on the Smith chart of the output power impedance IMPL1, which indicates the output power impedance ZL1 of the high output power amplifier unit, will be relocated to point B1 if the microstrip line MSL1 forming the first-stage matching network M12 is connected thereto, and then will be relocated to point C1 if the first-stage matching network M13 connecting the output power impedance ZL2 of the low output power amplifier unit is inserted in parallel thereto, and furthermore will be relocated to point D1 if the microstrip line MSL4 is connected thereto, and finally will be again relocated to point E1 if the capacitor C2 is connected in parallel thereto. The point E1 is the characteristic impedance found at the output terminal OUT, to which characteristic impedance point the output power impedance ZL1 of the high output power amplifier unit is to be matched.

Figure 7:
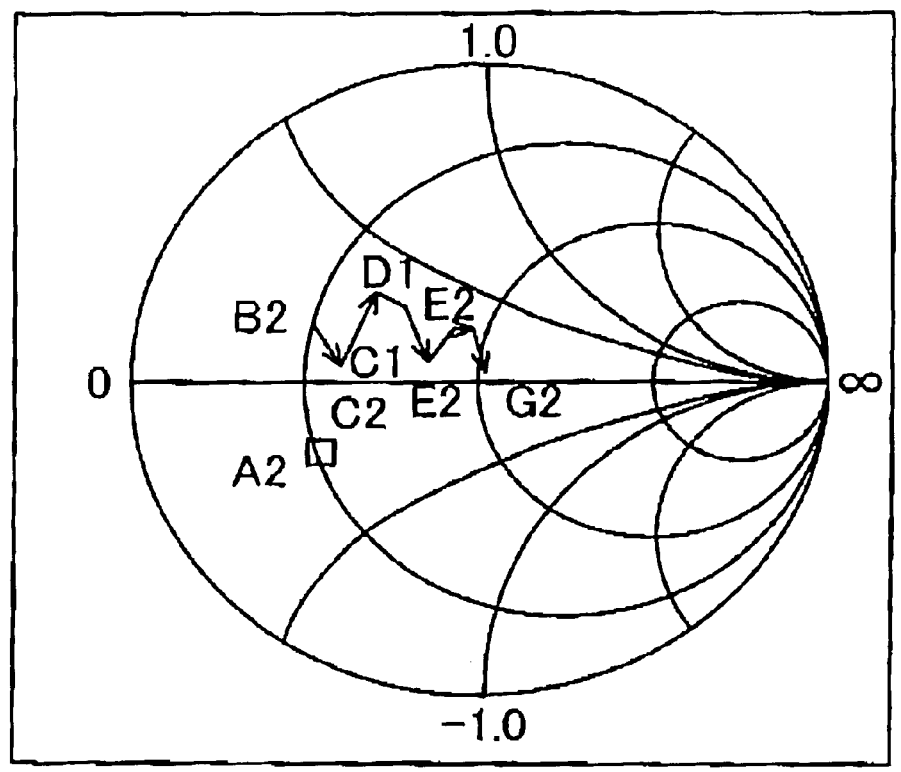
FIG. 7 is another chart describing the matching condition of the impedance matching network when the low output power amplifier unit is in operation and the low output power amplifier unit is in stop of operation.

In addition if the output power impedance ZL1 of the high output power amplifier unit is designated to as the output power impedance IMPL2 of the high output power amplifier unit in stop of operation mode, and the output power impedance ZL2 of the low output power amplifier unit is designated to as the output power impedance IMPS1 of the low output power amplifier unit in operating mode, then as shown in FIG. 7, the point A2 of the output power impedance ZL2 of the low output power amplifier unit, which is output power impedance IMPS1, on the Smith chart, will be first relocated to point B2 by connecting microstrip line MSL2 thereto, then relocated to point C2 by connecting the capacitor C1 in parallel thereto, furthermore relocated to point D2 by connecting microstrip line MSL3 thereto, also relocated to point E2 by connecting first-stage matching network M12 connecting output power impedance ZL1 of the high output power amplifier unit in parallel thereto, and further relocated to F2 by connecting the microstrip line MSL4 in parallel thereto, and finally relocated to point G2 by connecting the capacitor C2 in parallel thereto. The point G2 is the characteristic impedance found at the output terminal OUT, to which characteristic impedance the output power impedance ZL2 of the low output power amplifier unit is to be matched.

As can be appreciated from the foregoing description, In both cases when the power amplifier unit A11 is in operation and the power amplifier unit A12 is in stop of operation, and when the power amplifier unit A11 is in stop of operation and the power amplifier unit A12 is in operation, the condition of impedance matching will be satisfied, so that no radio frequency switch is required for switching between high and low output power, to be able to achieve a radio frequency power amplifier of a higher efficiency.

Figure 8:
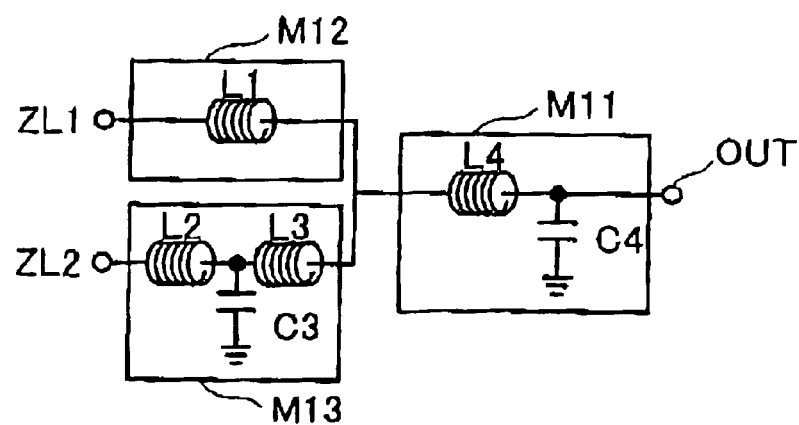
FIG. 8 is a schematic circuit diagram illustrating another typical example of matching network shown in FIG. 1.

Next, referring to FIG. 8 there are shown matching networks M12, M13, M11, which are designed with microstrip line MSL1, MSL2, MSL3, and MSL4 being replaced with inductances L1, L2, L3, and L4 respectively. The matching networks M12, M13, M11 shown in FIG. 8 are capable of operating in a manner exactly similar to those matching networks M12, M13, M11 shown in FIG. 5.

In the above description, a radio frequency power amplifier in accordance with the present invention have been described which may comprise two power amplifier units in correspondence to two output power levels, specifically high and low output power levels. However, it is quite possible that it may incorporate three power amplifier units, one power amplifier unit for each of high, medium, low output power levels. In such case each output of three power amplifier units may be connected to a first-stage matching network, output nodes of all three first-stage matching networks may be connected together, and a last-stage matching network may be inserted between the junction of three first-stage matching networks and the output terminal. Only one of three power amplifier units will be in operation in accordance with the output, and other two will be in stop of operation.

Three first-stage matching networks and one last-stage matching network as have been described above will be formed so that, when either one of three power amplifier units in operation while two others are in stop of operation, the output power impedance of the power amplifier unit in operation may match to the characteristic impedance. Thus, any of three power amplifier units may be impedance matched during operation.

<Second Embodiment>

Figure 9:
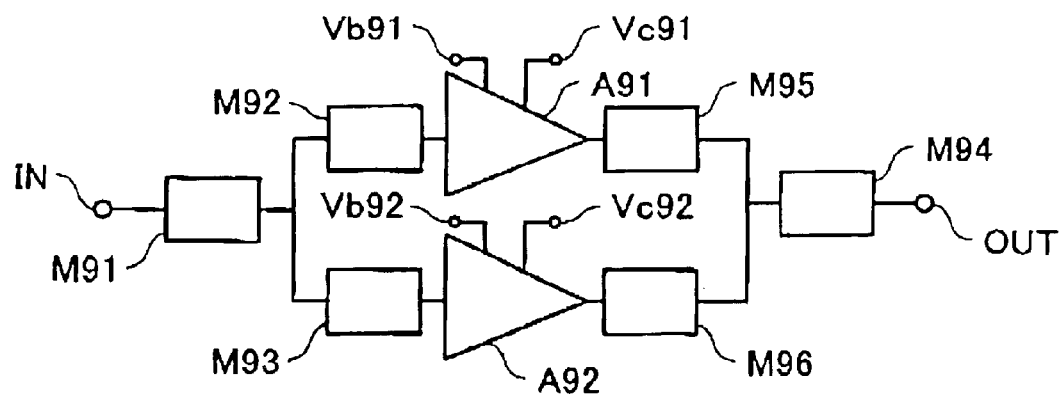
FIG. 9 is a schematic block diagram illustrating a second preferred embodiment of the radio frequency power amplifier in accordance with the present invention.

A preferred embodiment of radio frequency power amplifier having impedance matching applied to the input in accordance with the present invention is shown in FIG. 9. When a high output power amplifier unit A91 be in operation with a low output power amplifier unit A92 being in stop of operation mode, the radio frequency signal fed from input terminal IN will be passed through a first-stage matching network M91 and a last-stage matching network M92, then fed to the power amplifier unit A91 to be amplified therein. Thus an amplified signal will be passed through a first-stage matching network M95 and last-stage matching network M94 to the output terminal OUT.

In case when the high output power amplifier unit A91 is in sto of operation while the low output power amplifier unit A92 in operation, the radio frequency signal supplied from the input terminal IN will be passed through a first-stage matching network M91 and a last-stage matching network M93 to the low output power amplifier unit A92 to be amplified therein. Thereafter the signal will be passed through a first-stage matching network M96 and a last-stage matching network M94 to output to the output terminal OUT.

In this preferred embodiment, In both of two states that the high output power amplifier unit A91 is in operation and the low output power amplifier unit A92 is in stop of operation, and that on contrary the high output power amplifier unit A91 is in stop of operation and the low output power amplifier unit A92 is in operation, the matching networks M91, M92, M93 will be fromed so as to satisfy the impedance matching condition of the input impedance of the high output power amplifier unit A91 in operation and input impedance of the low output power amplifier unit A92 in operation with the characteristic impedance at the input terminal IN, in a manner similar to the preceding first preferred embodiment of the present invention. For the matching networks M94, M95, M96 the same circuit will be used as the networks M11, M12, M13 of the preceding first preferred embodiment.

Figure 10:
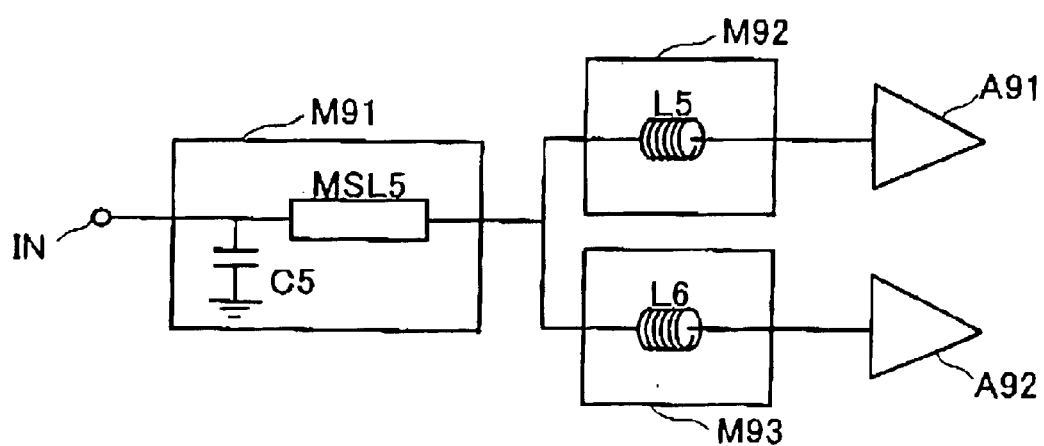
FIG. 10 is a schematic circuit diagram illustrating a typical example of matching network for input node shown in FIG. 9.

Now referring to FIG. 10 there is shown a typical example of networks M91, M92, M93. The matching network M91 may be comprised of a capacitor C5 connected to the input node and a microstrip line MSL5; the matching network M92 may be comprised of an inductor L5, and the matching network M93 may be comprised of an inductor L6.

As can be appreciated from the foregoing description, a radio frequency power amplifier of efficiency improved may be achieved without the need of a radio frequency switch for switching between high output power and low output power.

Also in the present embodiment as similar to the preceding first preferred embodiment, it may be equivalently conceivable that the output levels may be divided into three levels of high, middle, and low by having a power amplifier unit for each of three levels. In such a case to each of input nodes of three power amplifier units will be connected a last-stage matching network, input nodes of three last-stage matching networks will be connected together, and a first-stage matching network will be connected to the junction of three input nodes of last-stage matching network and the input terminal. Furthermore, for each of output node of three power amplifier units a first-stage matching network will be connected, the output nodes of three first-stage matching networks will be connected together, and a last-stage matching network will be connected between the junction of three input nodes of first-stage matching networks and the output terminal.

In addition, in accordance with the present embodiment of the present invention, it may also be devised in such a way that the matching networks are used solely in the input nodes, while on the other hand to the output nodes a radio frequency switch for output switching may be used. The switching of power amplifier units in accordance with their high or low output may be performed without using a radio frequency switch in the input nodes.

<Third Embodiment>

Figure 11:
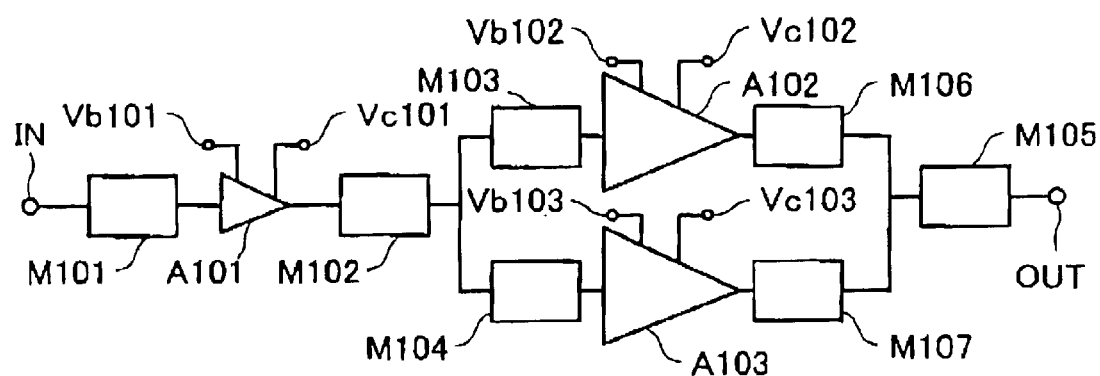
FIG. 11 is a schematic block diagram illustrating a third preferred embodiment of radio frequency power amplifier in accordance with the present invention.

Another preferred embodiment of the present invention is shown in FIG. 11, in which a low output power amplifier unit is used in-front of the radio frequency power amplifier stage shown in FIG. 9 to make a dual stage configuration. In FIG. 11, reference numeral A101 designates to an additional low output power amplifier unit, M101 to an input stage matching network placed in front of input node of the low output power amplifier unit A101.

When the high output power amplifier unit A102 is in operation and the low output power amplifier unit A103 is in stop of operation, the radio frequency signal applied from the input terminal IN will be fed through the input stage matching network M101 to the low output power amplifier unit A101 to be amplified therein. Thereafter the amplified signal will be passed through a first-stage matching network M102 and a last-stage matching network M103 and amplified then by the high output power amplifier unit A102. Thereafter the amplified signal will be passed through a first-stage matching network M106 and a last-stage matching network M105 to output to the output terminal OUT.

When the high output power amplifier unit A102 is suspended and the low output power amplifier unit A103 is in operation, then the radio frequency signal supplied from the input terminal IN will be passed through the input stage matching network M101 to the low output power amplifier unit A101 so as to be amplified therein. Then the signal will pass the first-stage matching network M102 and the last-stage matching network M104 to the low output power amplifier unit A103 so as to be amplified therein. Thereafter, the signal will be passed through the first-stage matching network M107 and the last-stage matching network M105 to output to the output terminal OUT.

In the present embodiment, when the high output power amplifier unit A102 is in operation and the low output power amplifier unit A103 is in stop of operation, and when on contrary the high output power amplifier unit A102 is in stop of operation and the low output power amplifier unit A103 is in operation, the matching networks M102, M103, M104 will be configured so as to satisfy the condition of impedance matching between the input impedance of the high output power amplifier unit A102 and the input impedance of the low output power amplifier unit A103 and the output impedance of the low output power amplifier unit A101, in a manner just similar to that described in the preceding second embodiment. With the above configuration, a radio frequency power amplifier with the efficiency improved may be achieved, without the need of a radio frequency switch for switching between the high output power and low output power. In addition, the present embodiment of the present invention has a higher amplitude because of a dual stage configuration of the power amplifier units.

<Forth Embodiment>

Figure 12:
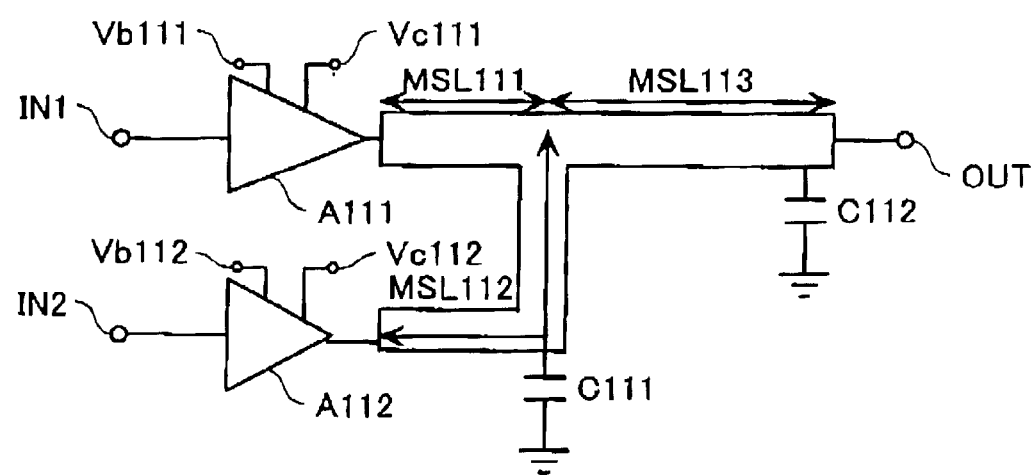
FIG. 12 is a schematic block diagram illustrating a fourth preferred embodiment of radio frequency power amplifier in accordance with the present invention.

Another preferred embodiment of the present invention is shown in FIG. 12, in which the first-stage matching network M12, first-stage matching network M13, and last-stage matching network M11 shown in FIG. 1 is formed by a unified microstrip line. The microstrip line MSL1 in the first-stage matching network M12 may be replaced with a microstrip line MSL111, the microstrip line MSL2 and microstrip line MSL3 in the first-stage matching network M13 with a microstrip line MSL112, and the microstrip line MSL4 in the last-stage matching network M11 with a microstrip line MSL113.

A capacitor C111 corresponding to the capacitor C1 in the first-stage matching network M13 is connected to the middleway of the microstrip line MSL112, with a capacitor C112 corresponding to the capacitor C2 of the last-stage matching network M11 being connected to the output node OUT of the microstrip line MSL113.

In the present embodiment, the transmission line length of the microstrip line MSL111 for use in the matching network for the high output power amplifier unit A111 is formed to be shorter than the transmission line length of the microstrip line MSL112 for use in the matching network for the low output power amplifier unit A112, so that the transmission line loss of the microstrip line MSL111 may be suppressed to a lower level, allowing decreasing the operation loss of the high output power amplifier unit A111 as well as improving the efficiency in the high output power amplifier unit A111.

<Fifth Embodiment>

Figure 13:
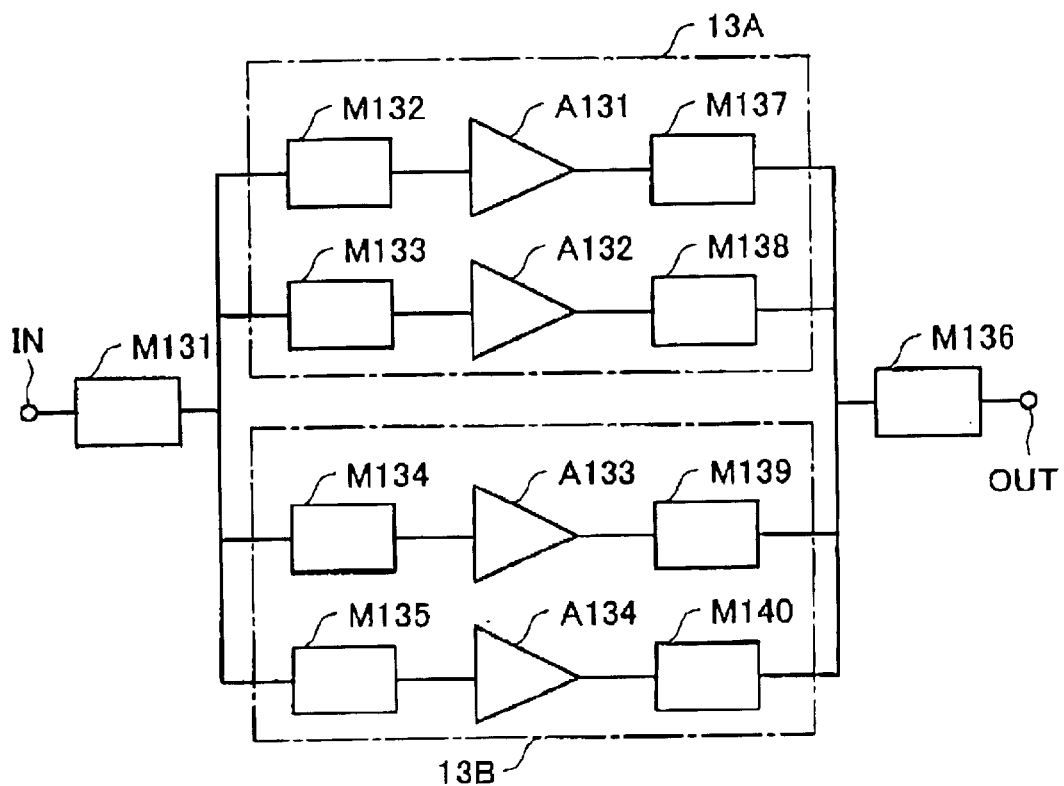
FIG. 13 is a schematic block diagram illustrating a fifth preferred embodiment of radio frequency power amplifier in accordance with the present invention.

Still another preferred embodiment of radio frequency power amplifier in accordance with the present invention is shown in FIG. 13, in which signals in frequency bands A and B mutually different each from other are further divided into high level and low level and either one of the signals is outputted. The radio frequency power amplifier may incorporate the power amplifier block 13A for the frequency band A and a power amplifier block 13B for the frequency band B.

The power amplifier block 13A may include a high output power amplifier unit A131 and a low output power amplifier unit A132, which are each connected to a first-stage matching network M137 and M138 in the output node respectively, also connected to a last-stage matching network M132 and M133 in the input node, respectively.

The power amplifier block 13B may include a high output power amplifier unit A133 and a low output power amplifier unit A134, which are each connected to a first-stage matching network M139 and M140 in the output node respectively, and to a last-stage matching network M134 and M135 in the input node, respectively.

The outputs of the first-stage matching networks M137 to M140 are connected together to a junction. A last-stage matching network M136 is connected between the junction and the output terminal OUT. The inputs of the last-stage matching networks M132 to M135 are also connected together to a junction. A first-stage matching network M131 is connected between the junction and the input terminal IN.

Controlling base voltage may allow operating any one among the power amplifier units A131 to A134 with other three in stop of operation. The matching networks M136 to M140 are formed so as to match the output impedance from the power amplifier unit in operation with the characteristic impedance at the output terminal OUT, for every power amplifier units. The matching networks M131 to M135 are also configured so as to match the input impedance to the power amplifier unit in operation with the characteristic impedance at the input terminal IN.

As can be appreciated from the foregoing description, when outputting one of signals of different frequency bands, one power amplifier unit is allowed to use by switching in accordance with the high or low output level, without the need of using a radio frequency switch.

Also it should be noted here that in the present embodiment, it is equivalently conceivable that the amplifier may be designed such that the signals may be switched by a radio frequency switch to feed to any power amplifier unit without using the input matching networks M131 to M135. The power amplifier unit can be switched in response to the level of output without the need of radio frequency switches in the output node.

<Sixth Embodiment>

Figure 14:
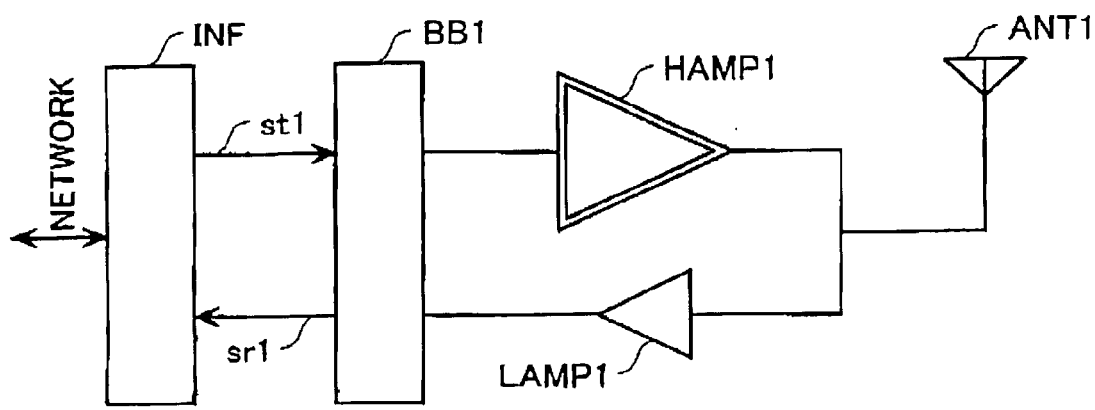
FIG. 14 is a schematic block diagram illustrating a sixth preferred embodiment of a portable cellular phone base station using a radio frequency power amplifier in accordance with the present invention.

A preferred embodiment of the radio frequency power amplifier in accordance with the present invention for use in a base station of mobile communication system is shown in FIG. 14. The base station is a component of a mobile communication system, together with portable cellular phone terminals (mobile terminals). A transmission signal St1 inputs from the network via an inter-base-station interface INF will be first signal processed in a baseband circuit BB1, then modulated thereby to a radio frequency signal. The radio frequency signal will be then amplified in a radio frequency power amplifier HAMP1 to emit from an antenna ANT1 to the space. The radio frequency power amplifier unit HAMP1 may use the present invention to have a significantly improved efficiency, allowing facilitating installation of the radio frequency power amplifier HAMP1 in the vicinity of the antenna ANT1.

The radio frequency signal received by the antenna ANT1 will be fed to a low noise booster LNAMP1 and amplified thereby to be demodulated and signal processed by the baseband circuit BB1 to the receiving signal Sr1.

<Seventh Embodiment>

Figure 15:
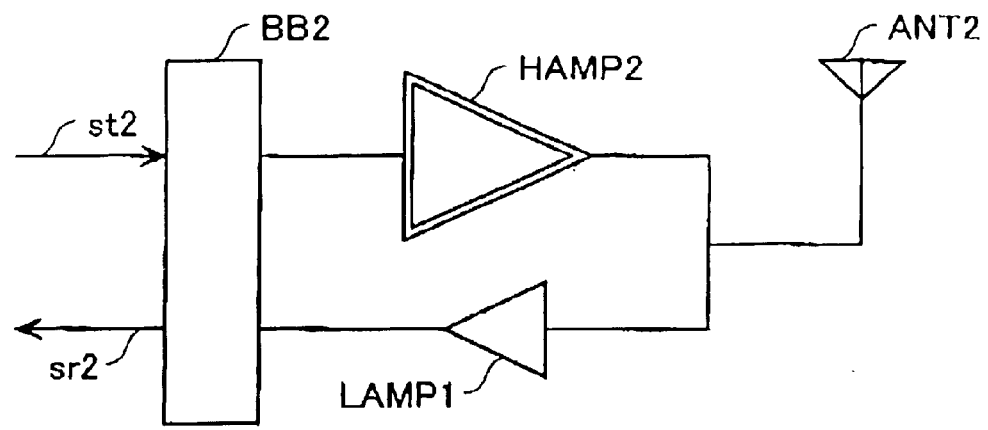
FIG. 15 is a schematic block diagram illustrating a seventh preferred embodiment of a portable cellular phone base station using a radio frequency power amplifier in accordance with the present invention.
Figure 16:
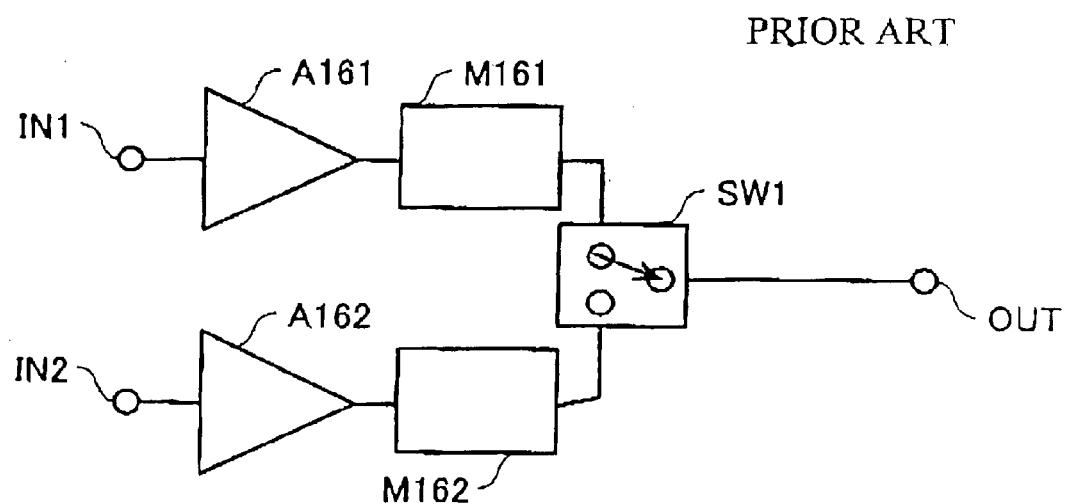
FIG. 16 is a schematic block diagram illustrating an exemplary radio frequency power amplifier in accordance with the Prior Art.

Yet another preferred embodiment of the radio frequency power amplifier in accordance with the present invention for use in a portable cellular phone terminal (mobile terminal) of a mobile communication system is shown in FIG. 15. A transmission signal St2 to be carried out will be signal processed and then modulated by a baseband circuit BB2 to a radio frequency signal. The radio frequency signal will be amplified by a radio frequency power amplifier HAMP2 to emit from an antenna ANT2 to the space. The radio frequency power amplifier HAMP2 uses the present invention to have a significantly improved efficiency, allowing achieving a cellular phone of much smaller in size with much lower power consumption.

The radio frequency receiving signal from the antenna ANT2 will be amplified by a low noise booster LNAMP2 and then demodulated and signal processed by the baseband circuit BB2 to a receiving signal Sr2.

In accordance with the present invention, when providing at least two power amplifier units each having different saturated output level and operating only one of units with others in stop of operation mode, the power amplifier unit in operation may achieve matching networks to satisfy the matching condition, allowing switching among power amplifier units without the need of a radio frequency switch, as well as giving lower output loss at the time of power amplification. The present invention may therefore provide a radio frequency power amplifier effectively suited for the downsizing of cellular phone terminals as well as base station installations.

It is further understood by those skilled in the art that the foregoing description is preferred embodiments of the disclosed device and that various changes and modifications may be made in the invention without departing from the spirit and scope thereof.

What is claimed is:

1. A radio frequency power amplifier, comprising:
   at least two power amplifier units, having a different saturated output power level from each other, one of the units being in operation by switching;
   first-stage matching networks, each connected to an output node of respective one of the at least two power amplifier units; and
   a last-stage matching network, connected between an output terminal and a junction permanently connecting output nodes of the first-stage matching networks together in parallel independently of ON/OFF switching of said at least two power amplifier units,
   wherein, when any one of the at least two power amplifier units is in operation and the other in stop of operation, the first-stage matching networks and the last-stage matching network are formed so that impedance matching is established between the output impedance of the power amplifier unit in operation and the output characteristic impedance at the output terminal, for each of the at least two power amplifier units, and
   wherein said last-stage matching network is fixed in a circuit element value thereof independently of ON/OFF switching of said at least two power amplifier units.

2. A radio frequency power amplifier, comprising:
   at least two power amplifier units, having a different saturated output power level from each other, one of the units being in operation by switching;
   first first-stage matching networks, each connected to the output node of respective one of the at least two power amplifier units;
   a first last-stage matching network, connected between a junction permanently connecting output nodes of the first first-stage matching networks together in parallel independently of ON/OFF switching of said at least two power amplifier units and an output terminal;
   second last-stage matching networks, each connected to the input node of respective one of the at least two power amplifier units; and
   a second first-stage matching network connected between the junction connecting input nodes of the second last-stage matching networks together in parallel and an input terminal,
   wherein, when any one of the at least two power amplifier units is in operation and the other in stop of operation, the first first-stage matching networks and the first last-stage matching network are formed so that impedance matching is established between the output impedance of the power amplifier unit in operation and the output impedance at the output terminal, for each of the at least two power amplifier units;
   the second first-stage matching network and the second last-stage matching networks are formed so that impedance matching is established between the input impedance of the power amplifier unit in operation and the input characteristic impedance at the input terminal, for each of the at least two power amplifier units, and
   wherein said first last-stage matching network is fixed in a circuit element value thereof independently of ON/OFF switching of said at least two power amplifier units.

3. A radio frequency power amplifier, comprising:
   at least two power amplifier units, having a different saturated output power level from each other, one of the units being in operation by switching;
   last-stage matching networks, each connected to the input node of respective one of the at least two power amplifier units; and
   a first-stage matching network, connected between an input terminal and a junction connecting input nodes of the last-stage matching networks together in parallel,
   wherein, when any one of the at least two power amplifier units is in operation and the other in stop of operation, the first-stage matching network and the last-stage matching networks are configured so that impedance matching is established between the input impedance of the power amplifier unit in operation and the input characteristic impedance at the input terminal, for each of the at least two power amplifier units.

4. A radio frequency power amplifier according to claim 1, wherein the length of signal transmission line used for said first-stage matching network connected to the power amplifier unit having larger saturation output power level from within said at least two power amplifier units is shorter than the length of signal transmission line used for said first-stage matching network connected to the power amplifier unit having smaller saturation output power level from within said at least two power amplifier units.

5. A radio frequency power amplifier according to claim 2, wherein the length of signal transmission line used for said first first-stage matching network connected to the power amplifier unit having larger saturation output power level from within said at least two power amplifier units is shorter than the length of signal transmission line used for said first first-stage matching network connected to the power amplifier unit having smaller saturation output power level from within said at least two power amplifier units.

6. A base station, for use in a mobile communication system together with mobile terminals, comprising:
   a baseband circuit for processing and modulating a transmission signal inputted through an inter-base-station interface to output a radio frequency signal;
   a radio frequency power amplifier having at least two power amplifier units, having a different saturated output power level from each other, one of the units being in operation by switching; first-stage matching networks, each connected to an output node of respective one of the at least two power amplifier units; and a last-stage matching network, connected between an output terminal and a junction permanently connecting output nodes of the first-stage matching networks together in parallel independently of ON/OFF switching of said at least two power amplifier units, wherein, when any one of the at least two power amplifier units is in operation and the other in stop of operation, the first-stage matching networks and the last-stage matching network are formed so that impedance matching is established between the output impedance of the power amplifier unit in operation and the output characteristic impedance at the output terminal, for each of the at least two power amplifier units, and wherein said last-stage matching network is fixed in a circuit element value thereof independently of ON/OFF switching of said at least two power amplifier units, for amplifying the radio frequency signal; and an antenna for emitting an output signal of the radio frequency power amplifier into space.

7. A mobile terminal for use in a mobile communication system together with a base station, comprising:

a baseband circuit for processing and modulating a transmission signal to output a radio frequency signal;

a radio frequency power amplifier having at least two power amplifier units, having a different saturated output power level from each other, one of the units being in operation by switching; first-stage matching networks, each connected to an output node of respective one of the at least two power amplifier units; and a last-stage matching network, connected between an output terminal and a junction permanently connecting output nodes of the first-stage matching networks together in parallel independently of ON/OFF switching of said at least two power amplifier units, wherein, when any one of the at least two power amplifier units is in operation and the other in stop of operation, the first-stage matching networks and the last-stage matching network are formed so that impedance matching is established between the output impedance of the power amplifier unit in operation and the output characteristic impedance at the output terminal, for each of the at least two power amplifier units, and wherein said last-stage matching network is fixed in a circuit element value thereof independently of ON/OFF switching of said at least two power amplifier units, for amplifying the radio frequency signal; and an antenna for emitting an output signal of the radio frequency power amplifier.

* * * * *